US012322578B2

(12) United States Patent
Nagaseki et al.

(10) Patent No.: US 12,322,578 B2
(45) Date of Patent: Jun. 3, 2025

(54) EXHAUST DEVICE, PROCESSING APPARATUS, AND EXHAUSTING METHOD

(71) Applicant: Tokyo Electron Limited, Tokyo (JP)

(72) Inventors: Kazuya Nagaseki, Miyagi (JP); Kazuki Moyama, Miyagi (JP); Toshiya Matsuda, Tokyo (JP); Naokazu Furuya, Miyagi (JP); Tatsuro Ohshita, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 746 days.

(21) Appl. No.: 17/342,668

(22) Filed: Jun. 9, 2021

(65) Prior Publication Data

US 2021/0296102 A1   Sep. 23, 2021

Related U.S. Application Data

(63) Continuation of application No. 16/205,558, filed on Nov. 30, 2018, now Pat. No. 11,315,770.

(30) Foreign Application Priority Data

Dec. 5, 2017   (JP) .................. 2017-233152

(51) Int. Cl.
*H01L 21/67* (2006.01)
*C23C 16/44* (2006.01)
(Continued)

(52) U.S. Cl.
CPC .... *H01J 37/32834* (2013.01); *C23C 16/4412* (2013.01); *C23C 16/45591* (2013.01);
(Continued)

(58) Field of Classification Search
CPC .......... H01J 37/32834; H01J 37/32633; C23C 16/4412; C23C 16/45591; H01L 21/6719
See application file for complete search history.

(56) References Cited

U.S. PATENT DOCUMENTS

| 4,977,855 | A | 12/1990 | Ohmi et al. |
| 5,271,719 | A | 12/1993 | Abe et al. |

(Continued)

FOREIGN PATENT DOCUMENTS

| JP | S59-013328 | 1/1984 |
| JP | S60-140764 U | 9/1985 |

(Continued)

OTHER PUBLICATIONS

Abreu, Raul A., et al., "Causes of anomalous solid formation in the exhaust systems of low-pressure chemical vapor deposition and plasma enhanced chemical vapor deposition semiconductor processes" J. Vac. Sci. Technol. B 12(4), Jul./Aug. 1994.

(Continued)

*Primary Examiner* — Aiden Lee
(74) *Attorney, Agent, or Firm* — IPUSA, PLLC

(57) ABSTRACT

An exhaust device including an exhaust mechanism and an exhaust unit is provided. The exhaust mechanism includes a first blade unit and a second blade unit provided in an exhaust space of a processing vessel including a processing space of a vacuum atmosphere for applying a process to a workpiece. The first blade unit and the second blade unit are arranged coaxially with a periphery of the workpiece, and at least one of the first blade unit and the second blade unit is rotatable. The exhaust unit is provided at a downstream side of the exhaust mechanism and communicates with the exhaust space. The exhaust unit is configured to exhaust gas in the processing vessel.

15 Claims, 16 Drawing Sheets

(51) Int. Cl.
*C23C 16/455* (2006.01)
*C23C 16/52* (2006.01)
*H01J 37/32* (2006.01)
*H01L 21/673* (2006.01)

(52) U.S. Cl.
CPC ........ *C23C 16/52* (2013.01); *H01J 37/32633* (2013.01); *H01J 37/32651* (2013.01); *H01L 21/67017* (2013.01); *H01L 21/6719* (2013.01); *H01L 21/67393* (2013.01); *H01J 2237/3341* (2013.01)

(56) References Cited

U.S. PATENT DOCUMENTS

| | | |
|---|---|---|
| 5,354,179 A | 10/1994 | Maruyama et al. |
| 5,782,609 A | 7/1998 | Kemoto et al. |
| 5,997,589 A | 12/1999 | Tien |
| 6,382,249 B1 | 5/2002 | Kawasaki et al. |
| 6,655,937 B2 | 12/2003 | Hasert et al. |
| 2003/0034701 A1 | 2/2003 | Weeber et al. |
| 2005/0042118 A1 | 2/2005 | Sekiguchi et al. |
| 2005/0081882 A1 | 4/2005 | Greer et al. |
| 2005/0247265 A1 | 11/2005 | Devine et al. |
| 2006/0213566 A1 | 9/2006 | Johnson |
| 2006/0225648 A1* | 10/2006 | Rasheed ........... H01L 21/31612 257/E21.279 |
| 2006/0257243 A1 | 11/2006 | Moriya et al. |
| 2006/0263624 A1 | 11/2006 | Jabado et al. |
| 2006/0278165 A1 | 12/2006 | Shikawa et al. |
| 2006/0286401 A1 | 12/2006 | Kaiser et al. |
| 2007/0017445 A1 | 1/2007 | Takehara et al. |
| 2008/0011424 A1* | 1/2008 | Yin .................. H01J 37/32899 156/345.48 |
| 2008/0066859 A1 | 3/2008 | Kobayashi et al. |
| 2009/0246048 A1 | 10/2009 | Kawasaki et al. |
| 2010/0043894 A1 | 2/2010 | Moriya et al. |
| 2010/0192857 A1 | 8/2010 | Kobayashi et al. |
| 2010/0294431 A1* | 11/2010 | Maquin ............... H01J 37/3244 118/728 |
| 2011/0031214 A1* | 2/2011 | Kim .................. H01L 21/68785 156/345.26 |
| 2011/0200460 A1 | 8/2011 | Nonaka et al. |
| 2011/0265814 A1* | 11/2011 | Cruse ................ H01L 21/6719 134/1.1 |
| 2012/0211351 A1 | 8/2012 | Tomyo et al. |
| 2013/0243583 A1 | 9/2013 | Kawanishi et al. |
| 2014/0051253 A1* | 2/2014 | Guha ................ H01J 37/32633 156/345.33 |
| 2015/0060404 A1 | 3/2015 | Dhindsa et al. |
| 2015/0064923 A1 | 3/2015 | Matsumoto et al. |
| 2015/0111388 A1 | 4/2015 | Takahashi et al. |
| 2015/0240829 A1 | 8/2015 | Ohtachi et al. |
| 2015/0303836 A1 | 10/2015 | Omori |
| 2016/0160877 A1 | 6/2016 | Sakaguchi |
| 2016/0197001 A1 | 7/2016 | Samir |
| 2017/0298958 A1 | 10/2017 | Mochizuki et al. |
| 2017/0321723 A1 | 11/2017 | Lee |
| 2018/0237904 A1 | 8/2018 | Huang et al. |
| 2018/0355465 A1 | 12/2018 | Saito et al. |
| 2022/0186734 A1* | 6/2022 | Lill ................... H01L 21/67017 |

FOREIGN PATENT DOCUMENTS

| | | |
|---|---|---|
| JP | H11-297651 | 10/1999 |
| JP | 2000-183037 | 6/2000 |
| JP | 2000-283087 | 10/2000 |
| JP | 2001-035798 | 2/2001 |
| JP | 2001-193914 | 7/2001 |
| JP | 2002-239443 | 8/2002 |
| JP | 2005-207275 | 8/2005 |
| JP | 4222747 | 2/2009 |
| JP | 2011-504298 | 2/2011 |
| JP | 2014-056987 | 3/2014 |
| JP | 2015-062225 | 4/2015 |
| JP | 2017-056862 | 3/2017 |
| KR | 10-2011-0047085 | 5/2011 |
| KR | 10-2011-0047086 | 5/2011 |
| KR | 10-2015-0027007 | 3/2015 |
| KR | 10-2015-0044816 | 4/2015 |
| WO | 2011/093617 | 8/2011 |

OTHER PUBLICATIONS

Ye, Daoxing, et al., "Optimal design and experiment of exhaust vent on impeller of medium consistency pulp pump". Advances in Mechanical Engineering 2018, vol. 10(3) pp. 1-9. DOI: 10.1177/1687814018765557.

Hammond, M.L., "CVD Exhaust—Safety and Environmental Sanity." Journal de Physique IV Colloque C2, Sep. 1991, 02(C2), pp. 449-457. 10.1051/jp4:1991255ff. ffjpa-00249845f.

* cited by examiner

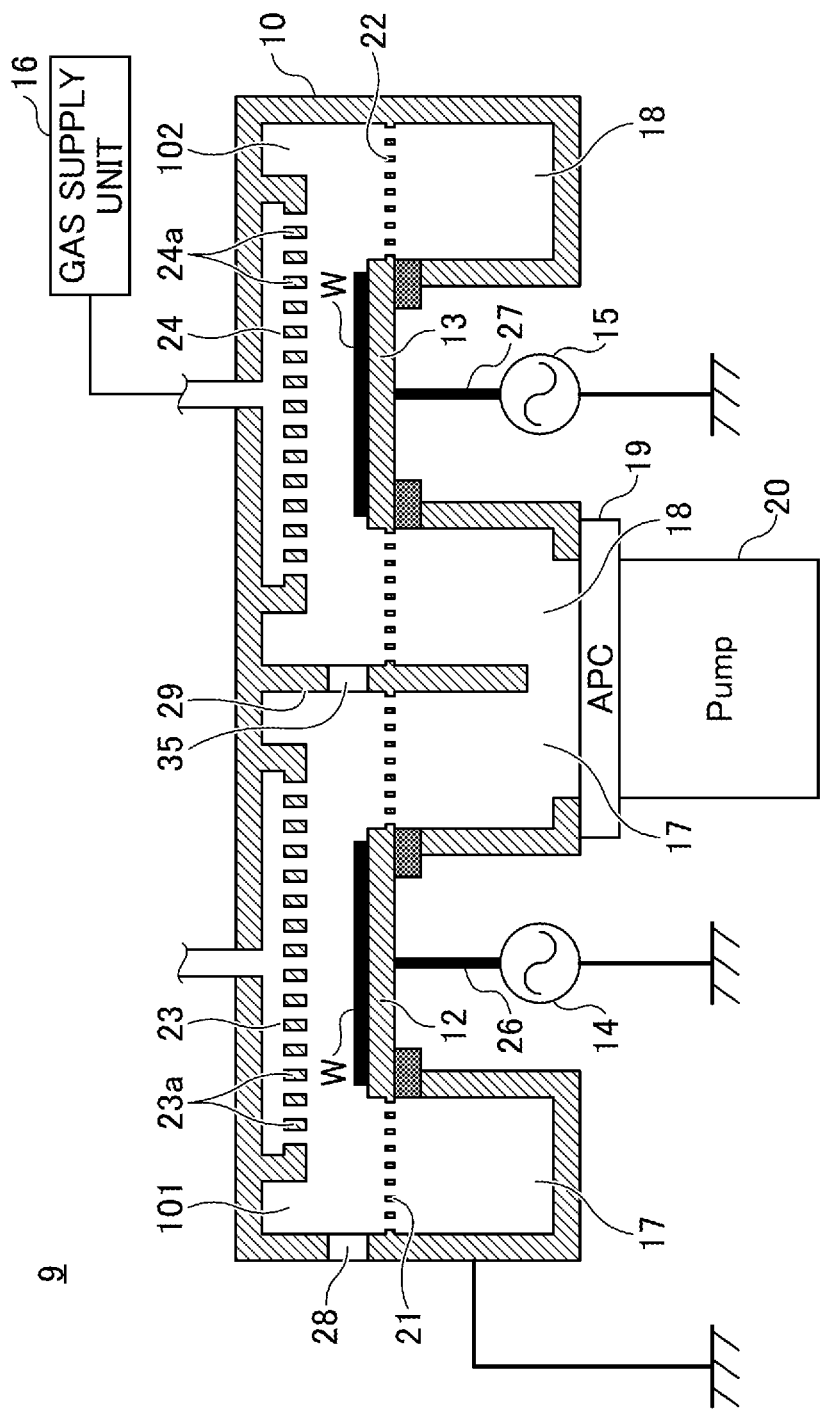

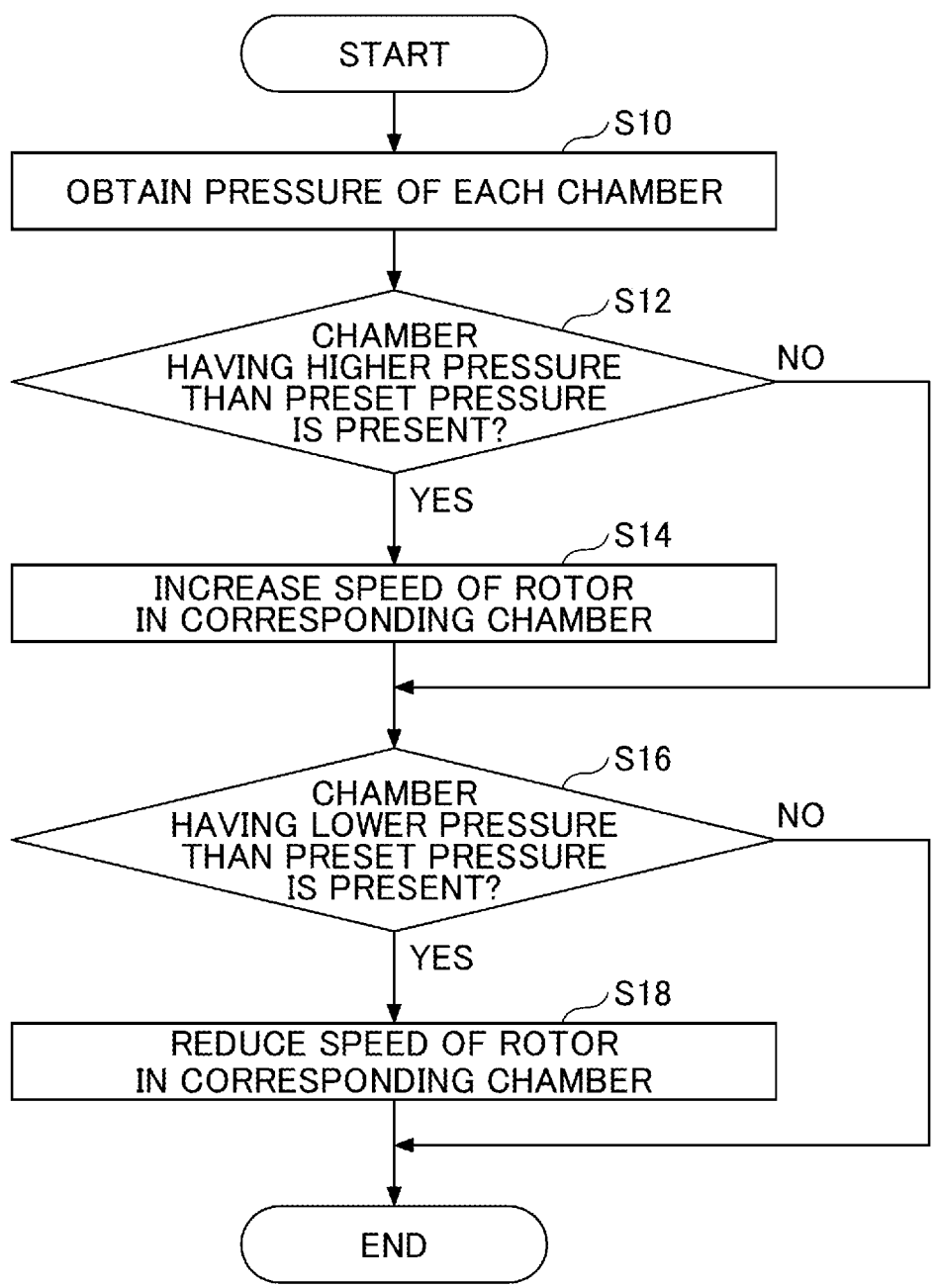

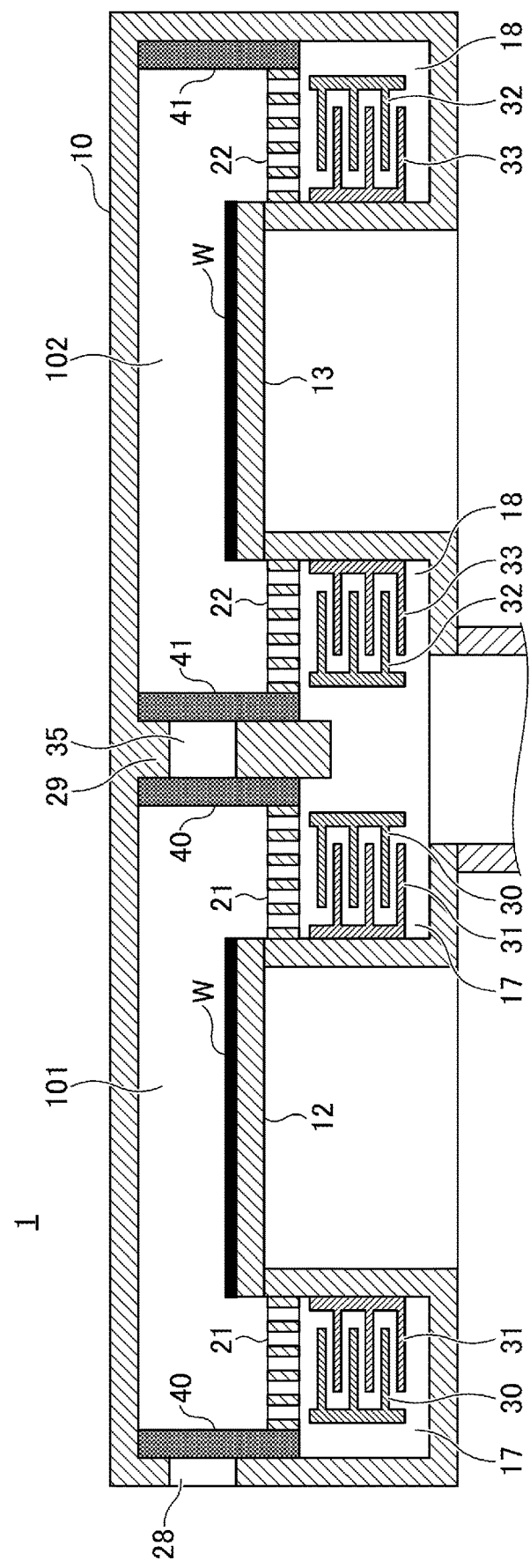

EXHAUST DEVICE, PROCESSING APPARATUS, AND EXHAUSTING METHOD

CROSS-REFERENCE TO RELATED APPLICATIONS

This application is a continuation of U.S. patent application Ser. No. 16/205,558 filed on Nov. 30, 2018, which is based on and claims priority to Japanese Patent Application No. 2017-233152 filed on Dec. 5, 2017. The entire contents of these applications are incorporated herein by reference.

BACKGROUND OF THE INVENTION

1. Field of the Invention

The present invention generally relates to an exhaust device, a processing apparatus, and an exhausting method.

2. Description of the Related Art

In a processing apparatus for semiconductor manufacturing in which a workpiece is processed in a processing chamber of a vacuum atmosphere, an exhaust device for controlling a pressure in the processing chamber to a predetermined pressure is provided. Various types of exhaust devices for the processing device are proposed (see Patent Document 1, for example).

If the pressure in the processing chamber is uneven, a process applied to the workpiece becomes uneven. Thus, it is preferable that the exhaust device is provided at a location in which unevenness of pressure in the processing chamber does not occur. For example, in a case in which an exhaust device is installed at an exhaust port provided at a sidewall of the processing apparatus or an outer circumference of a bottom portion of the processing apparatus, suction pressure occurs in a horizontal direction or an outer circumferential direction. Thus, unevenness of pressure in an exhaust space occurs, and as a result, unevenness of pressure in the processing chamber may occur.

However, under the processing apparatus, a high frequency power source, a power feeding rod, a pipe for supplying cooling gas for controlling temperature of a workpiece, or a pipe for coolant may be provided. Thus, because a space for placing these elements is required under the processing apparatus, it may be difficult to dispose the exhaust device at a center part under the processing device, which is appropriate for installing the exhaust device because unevenness of pressure in the processing chamber is less likely to occur.

CITATION LIST

Patent Document

[Patent Document 1] Japanese Laid-open Patent Application Publication No. 2000-183037

SUMMARY OF THE INVENTION

To solve the above problem, according to an embodiment of the present invention, an exhaust device including an exhaust mechanism and an exhaust unit is provided. The exhaust mechanism includes a first blade unit and a second blade unit provided in an exhaust space of a processing vessel including a processing space of a vacuum atmosphere for applying a process to a workpiece. The first blade unit and the second blade unit are arranged coaxially with a periphery of the workpiece, and at least one of the first blade unit and the second blade unit is rotatable. The exhaust unit is provided at a downstream side of the exhaust mechanism and communicates with the exhaust space. The exhaust unit is configured to exhaust gas in the processing vessel.

According to another embodiment of the present invention, a processing apparatus including a processing vessel and an exhaust device is provided. The processing vessel includes a processing space of a vacuum atmosphere for applying a process to a workpiece, and an exhaust space. The exhaust device includes an exhaust mechanism and an exhaust unit. The exhaust mechanism includes a first blade unit and a second blade unit provided in the exhaust space and arranged coaxially with a periphery of the workpiece. At least one of the first blade unit and the second blade unit is rotatable. The exhaust unit is provided at a downstream side of the exhaust mechanism and communicates with the exhaust space. The exhaust unit is configured to exhaust gas in the processing vessel.

According to yet another embodiment of the present invention, a method of exhausting gas in a processing vessel is provided. The processing vessel includes a processing space of a vacuum atmosphere for applying a process to a workpiece, and an exhaust space. The method includes a step of rotating at least one of a first blade unit and a second blade unit which are provided in the exhaust space and arranged coaxially with a periphery of the workpiece, a step of causing an exhaust unit, which is provided at a downstream side of the first blade unit and the second blade unit and communicates with the exhaust space, to exhaust gas in the processing vessel, and a step of controlling a rotational speed of the at least one of the first blade unit and the second blade unit, based on a predetermined condition.

In the yet another embodiment of the present invention, the processing vessel may include a wall separating the processing space into multiple processing chambers. Each of the processing chambers may be capable of placing a workpiece and may be provided with the first blade unit and the second blade unit arranged coaxially with a periphery of the workpiece. In the step of rotating, at least one of the first blade unit and the second blade unit in each of the processing chambers may be rotated. In the step of controlling, a rotational speed of the at least one of the first blade unit and the second blade unit of each of the processing chambers may be controlled independently with respect to other processing chambers, based on pressures measured in the respective processing chambers.

BRIEF DESCRIPTION OF THE DRAWINGS

FIG. 1A is a diagram illustrating an example of a processing apparatus according to a comparative example;

FIG. 5 is a flowchart illustrating an example of an exhaust process according to the embodiment;

FIG. 8A and FIG. 8B are diagrams illustrating an example of a loading/unloading operation of a wafer.

DETAILED DESCRIPTION OF EMBODIMENTS

In the following, embodiments of the present invention will be described with reference to the drawings. The embodiments to be described below aim at lowering unevenness of pressure in a processing chamber. Note that in the following descriptions and the drawings, elements having substantially identical features are given the same reference symbols and overlapping descriptions may be omitted.

[Overall Configuration of Processing Apparatus]

Figure 1B:
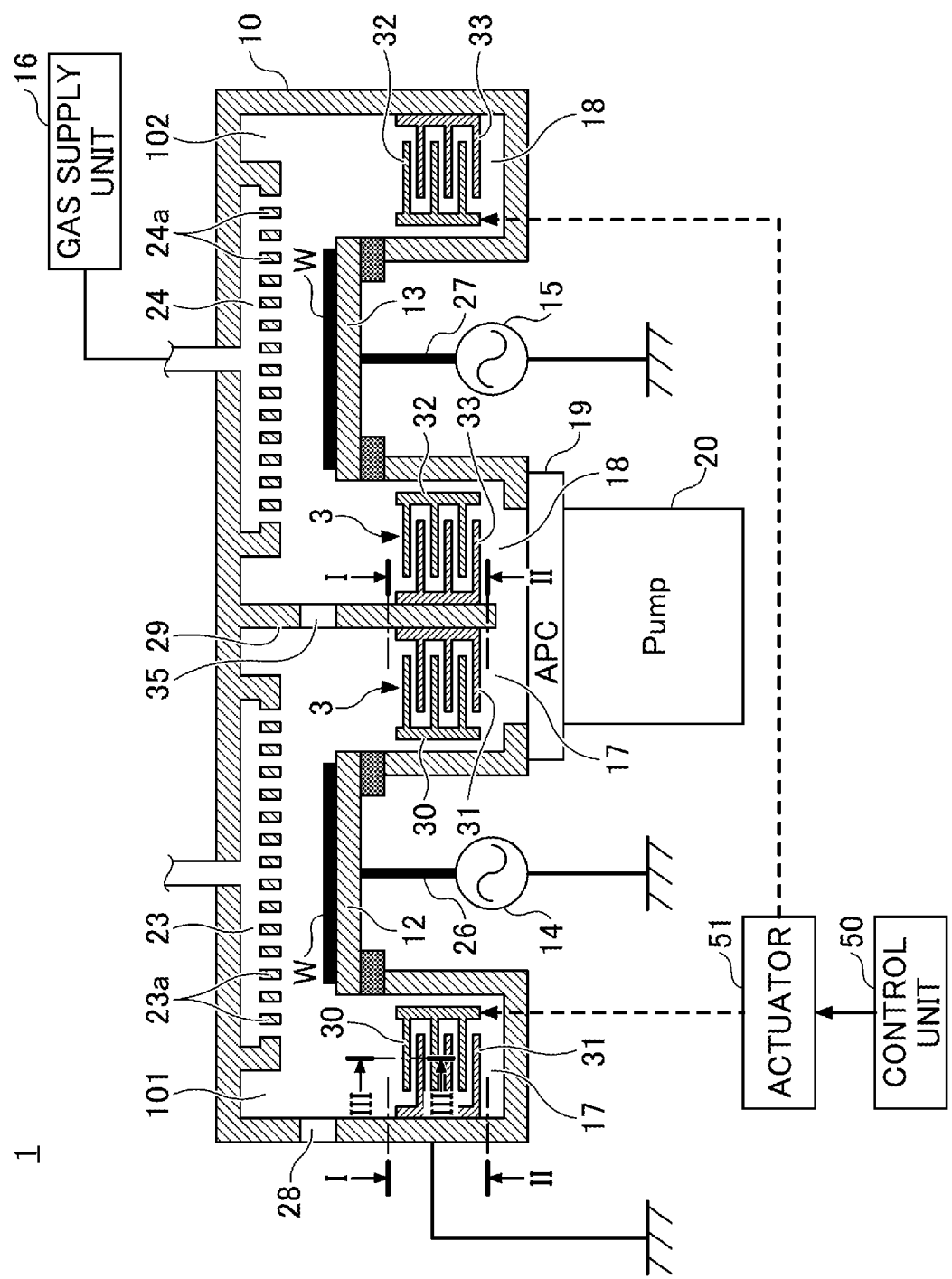
FIG. 1B is a diagram illustrating an example of a processing apparatus according to an embodiment.

First, a configuration of a batch type processing apparatus according to the present embodiment and a configuration of a batch type processing apparatus according to a comparative example will be described by comparing with each other. FIG. 1A is a diagram illustrating an example of a configuration of the batch type processing apparatus 9 according to the comparative example, and FIG. 1B is a diagram illustrating an example of a configuration of the batch type processing apparatus 1 according to the present embodiment.

The batch type processing apparatus 9 according to the comparative example and the batch type processing apparatus 1 according to the present embodiment are apparatuses which can process multiple semiconductor wafers W (hereinafter referred to as "wafers") simultaneously. Each of the processing apparatus 1 and the processing apparatus 9 includes a cylindrical processing vessel 10 formed of aluminum. To an internal surface of the processing vessel 10, anodic oxidation treatment is applied, for example. The processing vessel 10 is grounded.

A processing space of the processing vessel 10 for processing wafers W is separated into multiple processing chambers by cylindrical walls 29. In the present embodiment, in addition to processing chambers 101 and 102, another two processing chambers are formed by four cylindrical walls 29, and four wafers W can be processed at the same time. Note that the number of processing chambers is not limited to four. Also, in the following, a configuration of only the two processing chambers 101 and 102 will be described, and descriptions about the other two processing chambers will be omitted, for convenience of explanation. However, the configuration and the function of the other two processing chambers are the same as the configuration and the function of the two processing chambers 101 and 102.

There are two differences between the processing apparatus 9 according to the comparative example in FIG. 1A and the processing apparatus 1 according to the present embodiment in FIG. 1B. The first difference is that the processing apparatus 1 according to the present embodiment in FIG. 1B includes an exhaust mechanism 3 in exhaust spaces 17 and 18 which are positioned below stages 12 and 13 used for disposing wafers W, whereas the processing apparatus 9 according to the comparative example in FIG. 1A does not include an exhaust mechanism in the exhaust spaces 17 and 18. The exhaust mechanism 3 includes a set of a rotor 30 and a stator 31, and a set of a rotor 32 and a stator 33. The set of the rotor 30 and the stator 31 is stored in the processing chamber 101, and the set of the rotor 32 and the stator 33 is stored in the processing chamber 102.

The second difference is that the processing apparatus 9 according to the comparative example includes baffle plates 21 and 22 for separating the exhaust spaces 17 and 18 from processing space (the processing chambers 101 and 102), whereas the processing apparatus 1 according to the present embodiment does not include baffle plates. However, the processing apparatus 1 according to the present embodiment may include baffle plates.

Other configurations of the processing apparatus 9 and the processing apparatus 1 are the same. In the following, other components in the processing apparatus 9 or the processing apparatus 1 will be briefly described. On each of the stages 12 and 13, a wafer W is placed. At positions of a ceiling of the processing vessel 10 that face the stages 12 and 13, gas shower heads 23 and 24 for introducing processing gas into the processing vessel 10 are provided. To the gas shower heads 23 and 24, the processing gas is supplied from a gas supply unit 16. The processing gas is introduced, like a shower, to the processing chambers 101 and 102 from a large number of gas holes 23a and 24a provided at lower surfaces of the gas shower heads 23 and 24.

Feeding rods 26 and 27 are connected to the stages 12 and 13 respectively. Further, a high frequency power source 14 is connected to the stage 12 via the feeding rod 26 and a matching circuit, and a high frequency power source 15 is connected to the stage 13 via the feeding rod 27 and a matching circuit. By supplying high-frequency (radio frequency) electric power from the high frequency power sources 14 and 15 to the stages 12 and 13 respectively, plasma of processing gas is generated in the processing chambers 101 and 102, and a process such as etching is applied to the wafers by the generated plasma. Note that the high frequency power sources 14 and 15 may be configured such that predetermined high-frequency (radio frequency) electric power is applied to the stages 12 and 13 each serving as a lower electrode, or applied to the gas shower heads 23 and 24 each serving as an upper electrode.

At a side wall of the processing vessel 10, a loading/unloading port 28, through which a wafer W is loaded and/or unloaded, is provided. Also, at the wall 29 for separating the multiple processing chambers, a loading/unloading port 35, through which a wafer W is loaded and/or unloaded, is provided. From a bottom of the processing vessel 10 (processing chambers 101 and 102), a cylindrical wall extends upward to each of the underneath of the stages 12 and 13. The walls extending from the bottom of the processing chambers 101 and 102 are respectively connected to circumferences of the stages 12 and 13. Accordingly, because spaces at atmospheric conditions are formed under the stages 12 and 13, the feeding rods 26 and 27, the high frequency power sources 14 and 15, the pipe for supplying cooling gas for controlling temperature of a workpiece, and the pipe for coolant can be disposed under the stages 12 and 13.

In a lower level of the processing chambers 101 and 102, the exhaust spaces 17 and 18 are formed at an outer peripheral side of wafers W annularly in a circumferential direction. Underneath the wall 29 separating the processing chambers 101 and 102, the exhaust space 17 communicates with the exhaust spaces 18. Gas in the exhaust spaces 17 and 18 is exhausted by an APC (Adaptive Pressure Control) 19 and a turbomolecular pump 20 via an exhaust port. The APC 19 is a controller capable of controlling pressure by controlling an adjusting valve. After rough evacuation is performed by a dry vacuum pump, the turbomolecular pump 20 evacuates an inside of the processing vessel 10. The APC 19 and the turbomolecular pump 20 take together are an example of an exhaust unit provided at a downstream side of the exhaust mechanism 3. The exhaust unit is not required to include the APC 19.

As the turbomolecular pump 20 is shared by the multiple processing chambers (such as 101 and 102), gas in the exhaust spaces 17 and 18 at a central side of the processing apparatus 1 or 9 is more readily exhausted toward the turbomolecular pump 20. Accordingly, in the processing apparatus 9 according to the comparative example in FIG. 1A, pressures in the exhaust spaces 17 and 18 at a central side of FIG. 1A become lower than pressures in the exhaust spaces 17 and 18 at an outer side of FIG. 1A respectively. As a result, distribution of pressure in the processing chambers 101 and 102 also becomes similar to that in the exhaust spaces 17 and 18. Thus, in the processing apparatus 9 according to the comparative example in FIG. 1A, because of unevenness of pressure distribution in the processing chambers 101 and 102, unevenness of an etching rate or the like occurs in a circumferential direction of a wafer W, and it becomes difficult to evenly apply a process to the wafer W.

In the processing apparatus 1 according to the present embodiment in FIG. 1B, the exhaust mechanism 3 that improves uniformity of pressure distribution in the processing vessel 10 is provided, in order to uniformly apply a process to the wafer W by eliminating unevenness of an etching rate or the like. That is, an exhaust device for exhausting gas in the processing apparatus 1 according to the present embodiment includes the exhaust mechanism 3, and the APC 19 and the turbomolecular pump 20 provided at the downstream side of the exhaust mechanism 3. However, the exhaust device according to the present embodiment is not required to include the APC 19.

In the exhaust mechanism 3, the rotor 30 and the stator 31 form a pair, and the rotor 32 and the stator 33 form a pair. Each blade of the rotor 30 (or 32) and each blade of the stator 31 (or 33) is arranged alternately in multiple stages. The rotors 30 and 32 can respectively rotate around a center axis of the stage 12 (or a wafer W on the stage 12) and a center axis of the stage 13 (or a wafer W on the stage 13). The stators 31 and 33 are fixed to the wall 29 of the processing vessel 10. The rotor 30 and the stator 31 are arranged coaxially at an outer peripheral side of the wafer W (on the stage 12), and the rotor 32 and the stator 33 are arranged coaxially at an outer peripheral side of the wafer W (on the stage 12). Both the pair of the rotor 30 and the stator 31 and the pair of the rotor 32 and the stator 33 are examples of a set of a first blade unit and a second blade unit, at least one of which is rotatable. In addition, the exhaust mechanism 3 may be configured to be detachable or attachable as a unit.

According to the processing apparatus 1 in the present embodiment, if the processing apparatus 1 does not rotate the rotors 30 and 32, gas is exhausted through narrow spaces between the rotor 30 and the stator 31, or between the rotor 32 and the stator 33 because the pair of the rotor 30 and the stator 31, and the pair of the rotor 32 and the stator 33 are respectively in the exhaust spaces 17 and 18. Thus, because gas is unlikely to flow, a pressure in the exhaust space 17 or 18 becomes uniform. As a result, uniformity of pressure in the processing space can be realized.

However, if the rotors 30 and 32 are not rotated, gas exhaust efficiency decreases. Thus, the rotors 30 and 32 are preferably rotated in order to generate gas flow in the exhaust spaces 17 and 18. Accordingly, a pressure in a space upstream from the exhaust mechanism 3 becomes uniform. As a result, by keeping uniformity of pressure in the processing space, multiple processing chambers can be evacuated simultaneously by the turbomolecular pump 20. Therefore, in the processing apparatus 1 according to the present embodiment, uniformity of pressure distribution in the processing vessel 10 can be improved, and uniformity of a process, such as uniformity of an etching rate, can be realized.

The processing apparatus 1 according to the present embodiment has the same number of pairs of a rotor and a stator as the number of wafers W capable of being processed simultaneously. For example, if there are four processing chambers in the processing apparatus 1, the processing apparatus 1 has four pairs of the rotor and the stator. Rotational speeds of the four rotors can be controlled independently. The independent control of each of the rotors is performed by a control unit 50. Further, the number of the exhaust ports provided in the processing apparatus 1 and connected to the turbomolecular pump 20 may also be one or more.

The control unit 50 controls an overall operation of the processing apparatus 1. The control unit 50 includes a CPU (Central Processing Unit) and a memory such as a ROM (Read Only Memory) or a RAM (Random Access Memory). The CPU applies a predetermined process, such as etching, to a wafer W, in accordance with a recipe stored in the memory. In the recipe, control information of the processing apparatus 1 with respect to a process condition is defined. Examples of the control information include a time required for a process, a pressure (of exhaust gas), power or voltage of the high (radio) frequency power source, an amount of flow of each gas, a temperature inside the processing vessel (such as a temperature of the upper electrode, a temperature of a side wall of the processing vessel, a temperature of a wafer W, and a temperature of the electrostatic chuck), and a temperature of coolant. The recipe indicating the above process conditions may be stored in a hard disk drive or a semiconductor memory. Alternatively, the recipe may be recorded in a non-transitory computer readable removable recording medium, such as a CD-ROM or a DVD, and the non-transitory computer readable removable recording medium storing the recipe may be mounted at a predetermined location in a readable state.

The memory also stores information about a predetermined condition for performing independent control of the rotors being same in number as the number of the processing chambers. The predetermined condition may be at least one of a process condition (such as a pressure of each processing chamber and an amount of gas) defined in a recipe used for processing a wafer W, and timing of supplying and exhausting gas. The control unit 50 may change rotational speed of each of the rotors based on the predetermined condition, while controlling an exhaust process in the processing vessel 10 by controlling the turbomolecular pump 20.

The control unit 50 may measure a pressure of each processing chamber by using a pressure sensor provided in of the corresponding processing chamber, and in accordance with the measured pressure of each processing chamber, the control unit 50 may change rotational speed of each rotor by controlling an actuator 51. For example, the control unit 50 may independently control rotational speed of each rotor by controlling the actuator 51, in accordance with a difference of the measured pressures of multiple processing chambers.

[Arrangement and Operation of Rotor and Stator]

Figure 2A:
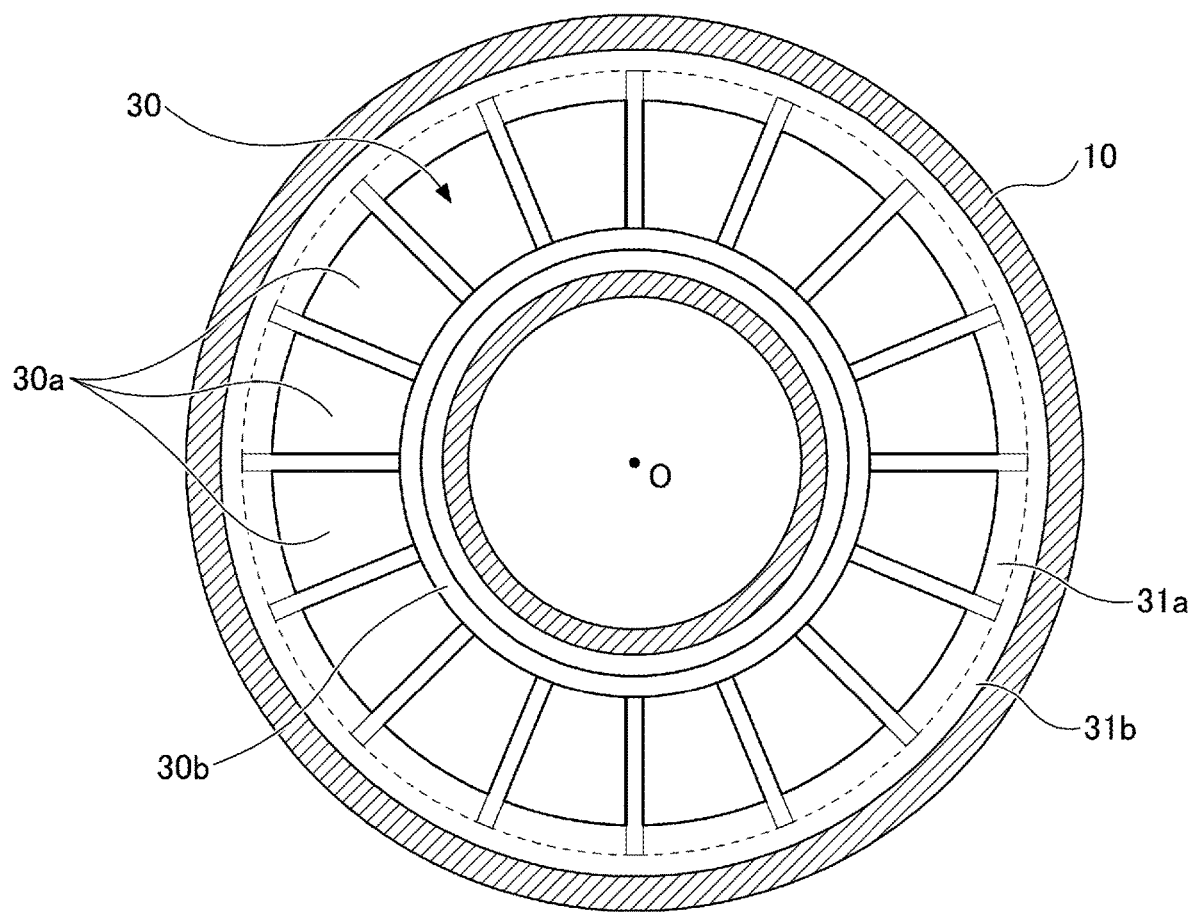
FIG. 2A and FIG. 2B are cross-sectional views of FIG. 1.
Figure 2B:
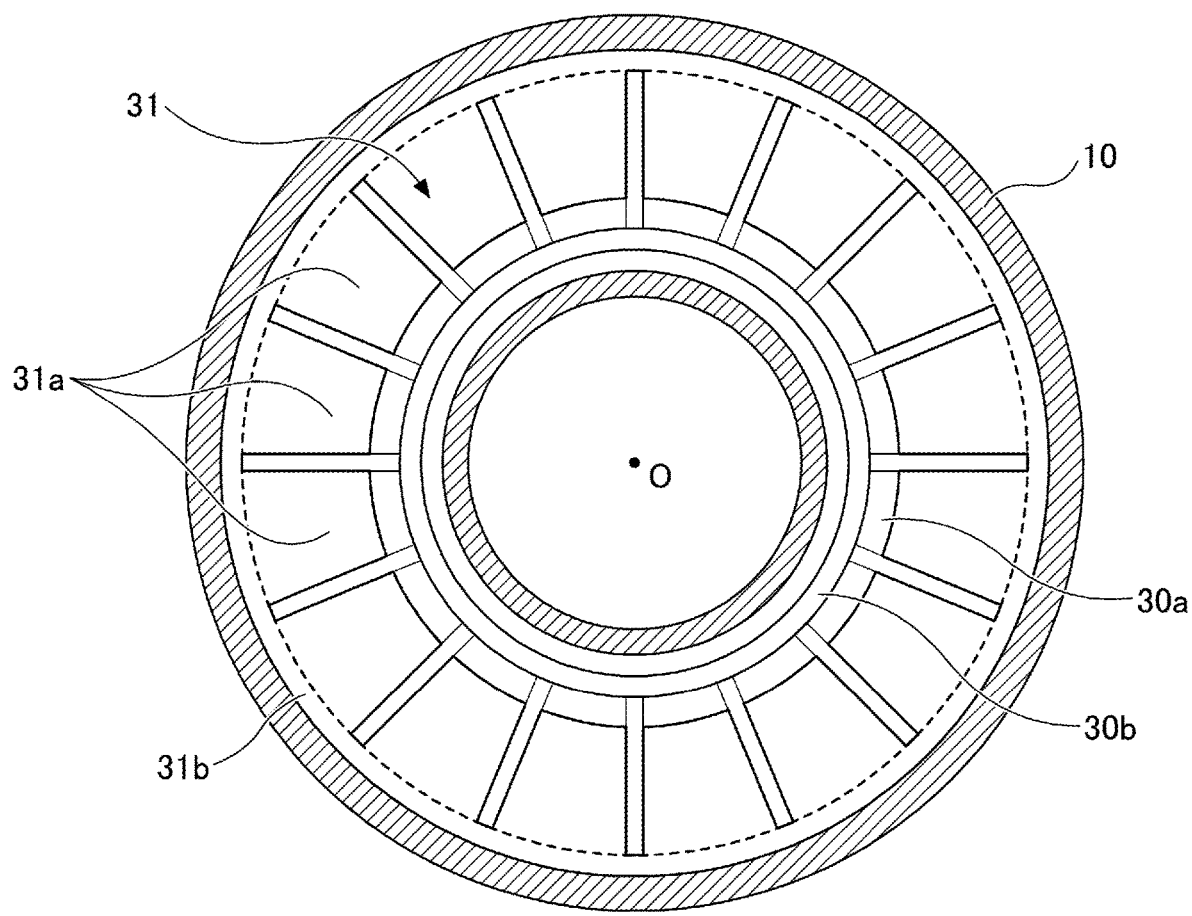
Figure 3:
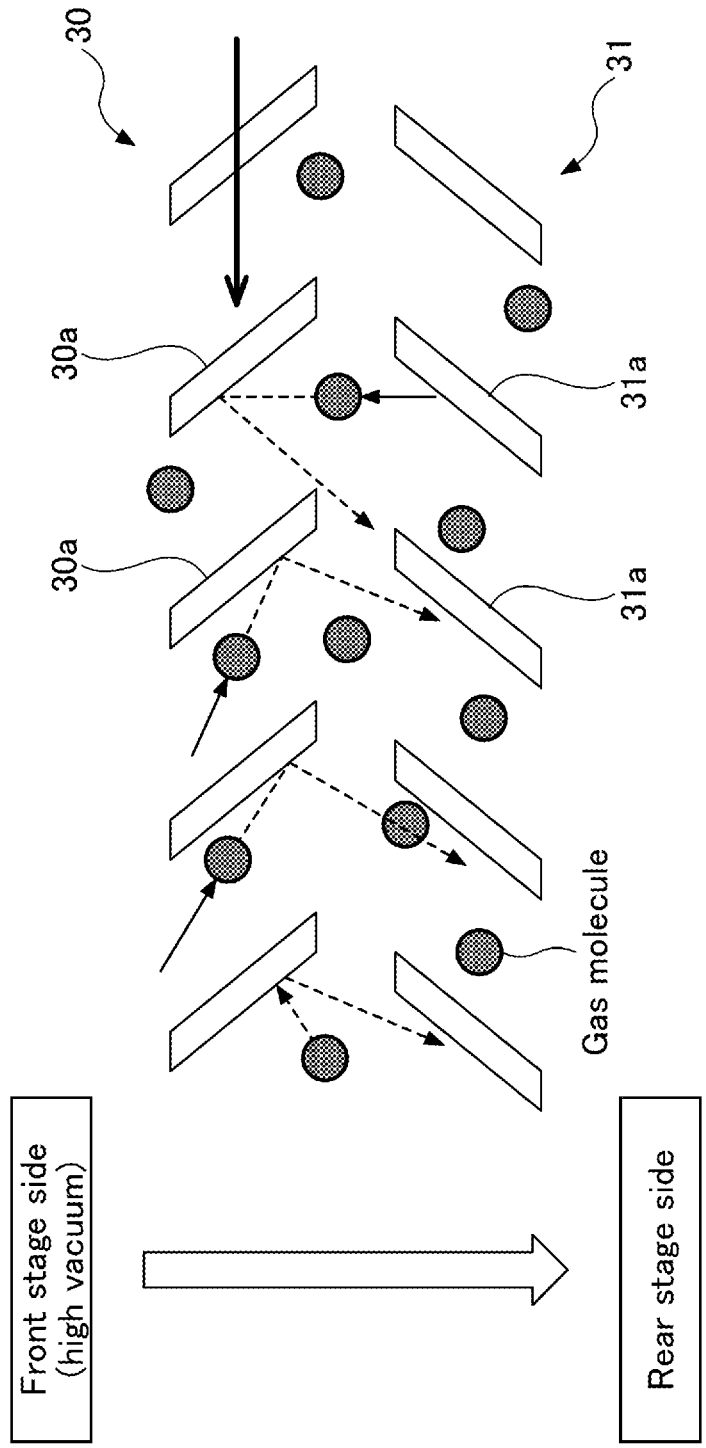
FIG. 3 is a cross-sectional view of FIG. 1.

An arrangement and an operation of the rotor and the stator will be described with reference to FIGS. 2A, 2B, and 3. Note that, in the present disclosure, FIGS. 2A and 2B are collectively called "FIG. 2". FIG. 2A is a cross-sectional view of FIG. 1 taken along a line I-I. FIG. 2B is a cross-sectional view of FIG. 1 taken along a line II-II. FIG. 3 is a cross-sectional view of FIG. 1 taken along a line III-III.

First, structures illustrated in FIG. 2 will be described. FIG. 2A and FIG. 2B are cross-sectional views of the processing chamber 101. As a cross-sectional view of the processing chamber 102 is also same as that of the processing chamber 101, a description of the processing chamber 102 will be omitted in the following description. In the processing chamber 101, a center axis O is a common axis of a wafer W, the stage 12, and a cylindrical wall of the processing chamber 101. The rotor 30 and the stator 31 are arranged coaxially, and a rotating axis of the rotor 30 and the stator 31 is the center axis O.

The rotor 30 and the stator 31 may be formed of aluminum, and anodic oxidation treatment may be applied to surfaces of the rotor 30 and the stator 31. Alternatively, the surfaces of the rotor 30 and the stator 31 may be coated with nickel by performing plating.

The rotor 30 includes a first base member 30b arranged below the stage 12 so as to surround a periphery of a wafer W (or the stage 12), and a large number of first blades 30a attached to the first base member 30b at regular intervals so as to extend outward. The first base member 30b is a ring-shaped member whose cross sectional area is larger than the area of a wafer W (or the stage 12).

The stator 31 includes a second base member 31b and a large number of second blades 31a attached to the first base member 30b at regular intervals so as to extend inward. The second base member 31b is a ring-shaped member whose cross sectional area is larger than the area of the rotor 30.

The first base member 30b is disposed at the side of a wafer W (or the stage 12), and is configured to be rotatable around the center axis O. The second base member 31b is fixed to the wall of the processing vessel 10. That is, the second base member 31b is not rotatable.

Each of the first blades 30a and the second blades 31a has a slanted surface, and is disposed in a circumferential direction of the center axis O. In the present embodiment, as illustrated in FIG. 2 and FIG. 3, the first blades 30a are disposed so as to extend outward, and the surface of each of the first blades 30a slants to an appropriate angle for gaseous molecules to pass through easily.

Also in the present embodiment, the second blades 31a are disposed so as to extend inward, and the surface of each of the second blades 31a slants to an appropriate angle for gaseous molecule not passing through easily.

Each of the first blades 30a and each of the second blades 31a is arranged alternately in multiple stages. FIG. 3 illustrates the first blades 30a and the second blades 31a corresponding to two stages. An upper side of FIG. 3 corresponds to a front stage side (high vacuum side) of the exhaust mechanism 3, and a lower side corresponds to a rear stage side of the exhaust mechanism 3. In the present embodiment, the rotor 30 rotates and the stator 31 is fixed. A relationship between a rotational direction of the rotor 30 and the slant of the first blades 30a or the second blades 31a is illustrated in FIG. 3, in a case in which a rotational direction of the rotor 30 is a right-to-left direction (a solid black arrow in FIG. 3). When gaseous molecules coming from the front stage side enter and leave the rotor 30, the gaseous molecules would tend to scatter towards various directions. However, because of a slope of the first blades 30a and a rotation of the first blades 30a, the gaseous molecules are directed toward the rear stage side of the exhaust mechanism 3. In addition, the gaseous molecules are directed to a direction in which the gaseous molecules are likely to pass through the stator 31. Further, gaseous molecules having moved back from the rear stage side and having passed through the stator 31 are directed toward the rear stage side again, by colliding with the rotor 30. The surfaces of the first blades 30a slant to an appropriate angle for gaseous molecules to pass through easily. The surfaces of the second blades 31a slant to an appropriate angle for gaseous molecules to not move backward easily.

When a large number of the first blades 30a rotate, by the first base member 30b being rotated by the actuator 51, the first blades 30a can expel exhaust gas downward (toward the exhaust port), in interoperation with the second blades 31a. Because the processing apparatus 1 according to the present embodiment is configured as described above, before a process such as etching is started or while the process is being performed, the inside of the processing vessel 10 is evacuated by rotating the first base member 30b and actuating the turbomolecular pump 20, and a high-vacuum state is maintained in the processing vessel 10.

A set of the exhaust mechanism 3 and the turbomolecular pump 20 having the above described configuration is an example of an exhaust device configured to exhaust gas inside the processing vessel in which a workpiece is processed in a vacuum atmosphere. According to the exhaust device, multiple processing chambers can be evacuated simultaneously by the turbomolecular pump 20, and a pressure in the exhaust space 17 or 18 becomes uniform. Thus, because uniformity of pressure of a processing space in the processing chamber 101 or 102 is improved, uniformity in a process can be realized.

In the present embodiment, a case in which the exhaust mechanism 3 includes the rotor 30 arranged in an inner side of the stator 31. However, a configuration of the exhaust mechanism 3 is not limited to the above mentioned configuration. For example, an arrangement of the rotor 30 and the stator 31 may be exchanged. That is, the rotor 30 may be arranged at an outer side of the stator 31. However, considering energy required for driving the rotor 30, it is preferable that the rotor 30 is arranged in an inner side of the stator 31. Alternatively, instead of providing a pair of the rotor 30 and the stator 31 in the exhaust mechanism 3, two rotors may be provided. In this case, the two rotors may be controlled such that a rotational direction of each rotor is opposite. By rotating the two rotors in opposite directions, even if a rotational speed of the two rotors is half a rotational speed of the rotor 30 (in the set of the rotor 30 and the stator 31), the same exhausting effect as that of the set of the rotor 30 and the stator 31 can be obtained.

Modified Examples

Figure 4A:
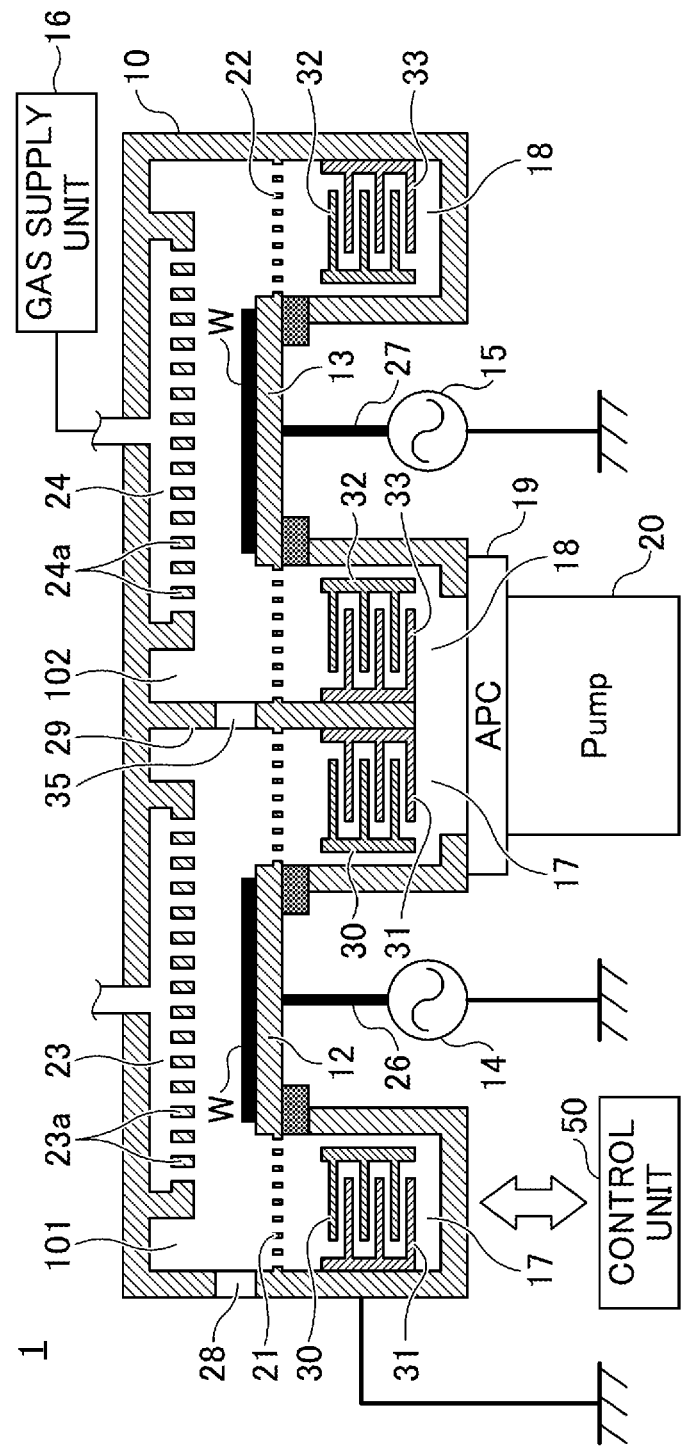
FIGS. 4A to 4C are diagrams each illustrating a modified example of the processing apparatus according to the embodiment.
Figure 4B:
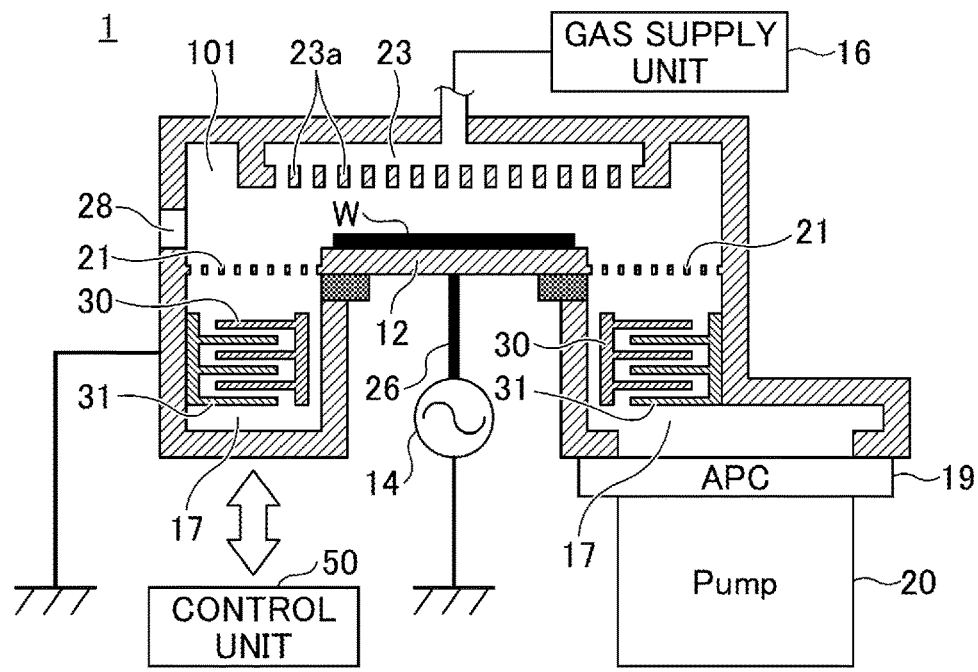
Figure 4C:
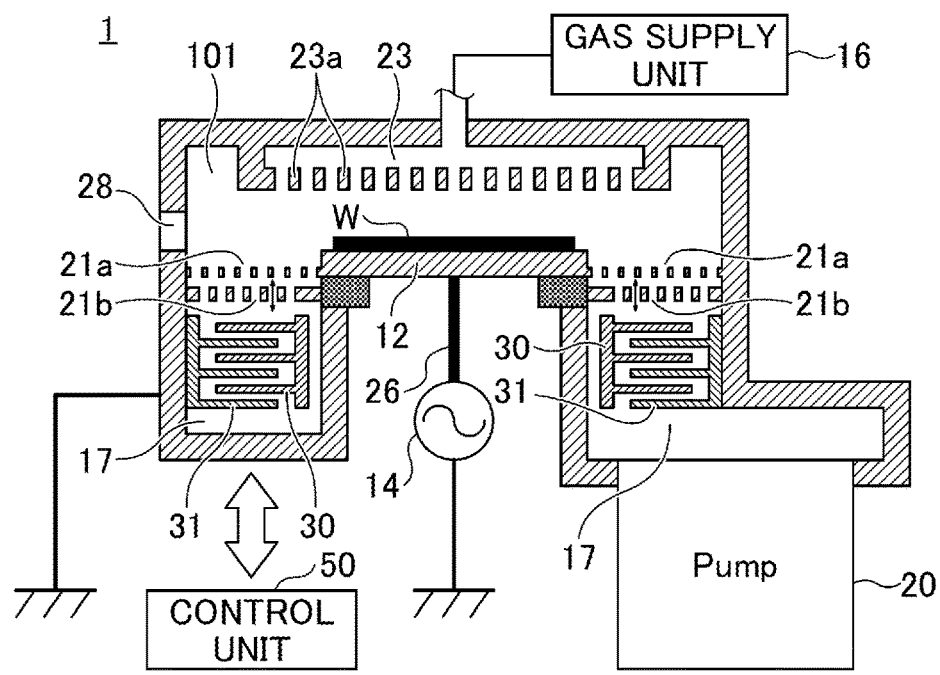

Next, modified examples of the exhaust device will be described with reference to FIGS. 4A to 4C. FIGS. 4A to 4C are diagrams illustrating examples of processing apparatuses 1 equipped with exhaust devices according to the modified examples 1 to 3 of the present embodiment respectively. FIG. 4A is a diagram illustrating the processing apparatus 1 equipped with the exhaust device according to modified example 1 of the present embodiment. In the processing apparatus 1 according to the modified example 1, the exhaust device includes baffle plates 21 and 22 at an upstream side of the exhaust mechanism 3, in addition to the exhaust mechanism 3, the APC 19, and the turbomolecular pump 20. The baffle plates 21 and 22 are provided to the processing chambers 101 and 102 respectively, and are arranged such that the baffle plates 21 and 22 surround the stages 12 and 13 respectively. Above the exhaust mechanism 3, the baffle plates 21 and 22 divide the processing vessel 10 into processing spaces (the processing chambers 101 and 102) for processing wafers W and the exhaust spaces 17 and 18. Multiple through holes are formed on the baffle plates 21 and 22.

The baffle plates 21 and 22 may be formed of aluminum. Coating having corrosion resistance for halogens may be applied to the aluminum of the baffle plates 21 and 22. For example, anodic oxidation treatment is applied to a surface of the aluminum, or $Y_2O_3$ or $Al_2O_3$ may be thermally sprayed on the aluminum.

Because of the baffle plates 21 and 22, flow of gas used in the processing chambers 101 and 102 is smoothed by the baffle plates 21 and 22, and the smoothed gas flows into the exhaust spaces 17 and 18. Similar to the above described embodiment, in the modified example 1, the exhaust mechanism 3 functions in interoperation with the turbomolecular pump 20. Because of the baffle plates 21 and 22, uniformity of pressure in the exhaust space 17 or 18 is further improved, and uniformity of pressure of a processing space in the processing chamber 101 or 102 is improved. Thus, uniformity in a process such as an etching rate can be realized. The baffle plates 21 and 22 also prevent the exhaust mechanism 3 from being exposed to plasma, because plasma is intercepted by the baffle plates 21 and 22.

FIG. 4B is a diagram illustrating the processing apparatus 1 equipped with the exhaust device according to modified example 2 of the present embodiment. In the processing apparatus 1 according to the modified example 2, the exhaust device includes the baffle plate 21 in addition to the exhaust mechanism 3 and the turbomolecular pump 20. In the processing apparatus 1 according to the modified example 2, only one processing chamber (the processing chamber 101) is present. Also in this case, depending on a location of the turbomolecular pump 20, unevenness of pressure in the exhaust space 17 may occur, and uniformity of pressure distribution in the processing chamber 101 may degrade.

To avoid occurrence of unevenness of pressure, the processing apparatus 1 according to the modified example 2 of the present embodiment, the exhaust mechanism 3 functions in interoperation with the turbomolecular pump 20 even though the processing apparatus 1 includes only one processing chamber 101. Thus, uniformity of pressure in the exhaust space 17 is improved, and uniformity of pressure of a processing space in the processing chamber 101 is improved. Accordingly, uniformity in a process can be realized.

FIG. 4C is a diagram illustrating the processing apparatus 1 equipped with the exhaust device according to modified example 3 of the present embodiment. In the processing apparatus 1 according to the modified example 3, the exhaust device includes baffle plates 21a and 21b at an upstream side of the exhaust mechanism 3, in addition to the exhaust mechanism 3 and the turbomolecular pump 20. The baffle plates 21a and 21b are arranged in parallel at specific intervals in a vertical direction. At least one of the baffle plates 21a and 21b is capable of being moved up and down, or is rotatable. Multiple through holes are formed on both the baffle plates 21a and 21b. As the exhaust device according to the modified example 3 can control pressure by using the two baffle plates 21a and 21b, the exhaust device does not have APC.

For example, the baffle plates 21a and 21b are arranged in advance such that the through holes of each of the baffle plates 21a and 21b are positioned in different locations. When a distance between the two baffle plates 21a and 21b becomes smaller by moving at least one of the baffle plates 21a and 21b upward or downward, a distance between the through hole of the baffle plate 21a and the through hole of the baffle plate 21b becomes smaller, and flow of gas is restrained.

Alternatively, flow of gas can also be changed by rotating at least one of the baffle plates 21a and 21b, to change a distance between the through hole of each of the baffle plates 21a and 21b.

The processing apparatus 1 according to the modified example 3 can control pressure in the processing space and the exhaust space by controlling opening/closing of the through holes provided on the baffle plates 21a and 21b. Thus, according to the modified example 3, the exhaust mechanism 3 functions in interoperation with the turbomolecular pump 20 and the baffle plates 21a and 21b. Accordingly, uniformity of pressure in the exhaust space 17 is further improved, uniformity of pressure of a processing space in the processing chamber 101 is improved, and therefore uniformity in a process can be realized.

[Exhaust Process]

Next, an example of an exhaust method performed in the processing apparatus 1 equipped with the exhaust device according to the present embodiment will be described with reference to FIG. 5. FIG. 5 is a flowchart illustrating an example of an exhaust process according to the embodiment. The exhaust process is controlled by the control unit 50.

When the exhaust process is started, the control unit 50 obtains pressure information of each of the processing chambers by using a pressure sensor provided in each of the processing chambers (step S10). Next, the control unit 50 determines if there is a processing chamber having a higher pressure than a preset pressure, by comparing the obtained pressure information with the preset pressure (step S12).

If it is determined that no processing chamber having a higher pressure than the preset pressure is present, the exhaust process proceeds to step S16. If a processing chamber having a higher pressure than the preset pressure is found (note that, in this paragraph, the found processing chamber is referred to as a "corresponding chamber"), the control unit 50 controls rotational speed of the rotor 30 in accordance with a difference between the preset pressure and the pressure in the corresponding chamber, to increase rotational speed of the rotor 30 in the corresponding chamber (step S14).

Next, the control unit 50 determines if there is a processing chamber having a lower pressure than the preset pressure (step S16). If it is determined that there is no processing chamber having a lower pressure than the preset pressure, the exhaust process terminates. If a processing chamber having a lower pressure than the preset pressure is found (note that, in this paragraph, the found processing chamber is referred to as a "corresponding chamber"), the control unit 50 controls rotational speed of the rotor 30 in accordance with a difference between the preset pressure and the pressure in the corresponding chamber, to decrease rotational speed of the rotor 30 in the corresponding chamber (step S18), and the exhaust process terminates.

The gas supply unit 16 supplies predetermined amounts of gas to the respective four processing chambers separately. Conversely, exhausting of gas is performed by the turbomolecular pump 20 common to the four processing chambers. Thus, because of individual differences of exhausting performance of each of the processing chambers, a pressure of each of the processing chambers may become different. However, in the exhaust method according to the present embodiment, rotational speed of the rotor of the exhaust mechanism 3 provided in each of the processing chambers can be controlled independently. Accordingly, individual differences of exhausting performance of each of the processing chambers can be counteracted.

For example, in a case in which a pressure in a processing chamber is to be decreased by exhausting gas, rotational speed of the rotor in the processing chamber may be increased. By increasing the rotational speed of the rotor, the number of gas molecules expelled per unit time becomes larger than that of a case in which only the adjusting valve is fully opened by the APC 19. Accordingly, the pressure in the processing chamber can be decreased faster than in a case in which only the APC 19 is controlled.

For example, in a case in which a pressure in a processing chamber is to be increased by supplying gas, rotational speed of the rotor in the processing chamber may be decreased. By decreasing the rotational speed of the rotor, the number of gas molecules expelled per unit time becomes smaller than that of a case in which only the adjusting valve is narrowed by the APC 19. Accordingly, the pressure in the processing chamber can be increased faster than in a case in which only the APC 19 is controlled.

In the exhaust method according to the present embodiment, the control unit 50 may preferably perform the above mentioned exhaust process in real-time, in which a pressure of each processing chamber is periodically or non-periodically acquired from a sensor provided to each processing chamber and in which the above mentioned exhaust process is performed based on the obtained pressure.

Further, the exhaust method according to the present embodiment is not limited to the method illustrated in FIG. 5, in which rotational speed of the rotor in each of the processing chambers is controlled in accordance with a difference between the preset pressure and a pressure of the corresponding processing chambers obtained from a sensor. For example, a method of controlling rotational speed of the rotor in each of the processing chambers, in accordance with a difference between the respective pressures of the processing chambers obtained from the sensors, may be adopted. As this method also enables control of speed of exhausting gas or supplying gas, individual differences of exhausting performance of each of the processing chambers in the processing apparatus 1 can be counteracted.

Alternatively, rotational speed of the rotor in each of the processing chambers may be controlled based on a predetermined condition. The predetermined condition is not limited to a condition based on pressure information obtained from a sensor in each of the processing chambers of pressure. Examples of the predetermined condition include a process condition such as a gas flow rate, and at least one of a timing of supplying gas and a timing of exhausting gas.

For example, in a process in which an etching process of a wafer W includes multiple steps, if different gases are used in a certain step and a next step after the certain step, gas in a processing chamber needs to be exchanged after the certain step and before the next step. That is, after gas used in the certain step is exhausted from a processing chamber, another gas to be used in the next step is introduced into the processing chamber. In the present embodiment, when the gas used in the certain step is exhausted, rotational speed of the rotor of the processing chamber may be increased in order to reduce a pressure in the processing chamber. Further, while executing the next step, rotational speed of the rotor of the processing chamber may be controlled to be lower than that in a case in which the gas used in the certain step is exhausted. According to the present embodiment, by performing the above mentioned rotational speed control of the rotor, a pressure of each processing chamber can be controlled more efficiently than in a case in which only the APC 19 is controlled.

Note that, when performing the above mentioned exhaust method in the processing apparatus 1 according to the present embodiment (or according to the modified example 1 or 2), the processing apparatus 1 may or may not include the APC 19.

[Loading/Unloading Wafer]

Next, with respect to the batch type processing apparatus 1 according to the present embodiment, how a wafer W is transported when the wafer W is loaded or unloaded will be described with reference to FIGS. 6A to 9B. FIGS. 6A to 9B are diagrams illustrating examples of a loading/unloading operation of a wafer performed in the processing apparatus 1 according to the present embodiment.

Structures of the processing apparatuses 1 illustrated in FIGS. 6A to 9B are the same as that of the processing apparatus 1 illustrated in FIG. 1. Illustration of some components in the processing apparatuses 1, such as the gas supply unit, the gas shower head, the feeding rod, the high frequency power source, and the turbomolecular pump, are omitted in FIGS. 6A to 9B. Also, in the processing apparatuses 1 illustrated in FIGS. 6A to 9B, the loading/unloading port 35 for a wafer W is formed at the wall 29 separating the processing chambers. In the processing chamber 101, loading/unloading of a wafer W is performed through the loading/unloading port 28. When a wafer W is loaded into (or unloaded from) the processing chamber 102, the wafer W is loaded or unloaded through the loading/unloading port 35, in addition to the loading/unloading port 28.

Further, in FIGS. 6A to 9B, shield members 40 and 41 are provided on at least a part of the side wall of the processing vessel 10 corresponding to the loading/unloading ports 28 and 35 of the processing chambers 101 and 102. The shield members 40 and 41 protect the cylindrical wall 29 of the processing vessel 10. A lifting mechanism (not illustrated) using an electromagnet or the like is connected to the shield members 40 and 41. Because of the lifting mechanism, the shield members 40 and 41 can be moved upward or downward when a wafer is loaded or unloaded, and thereby the loading/unloading ports 28 and 35 can be opened and/or closed.

Figure 6A:
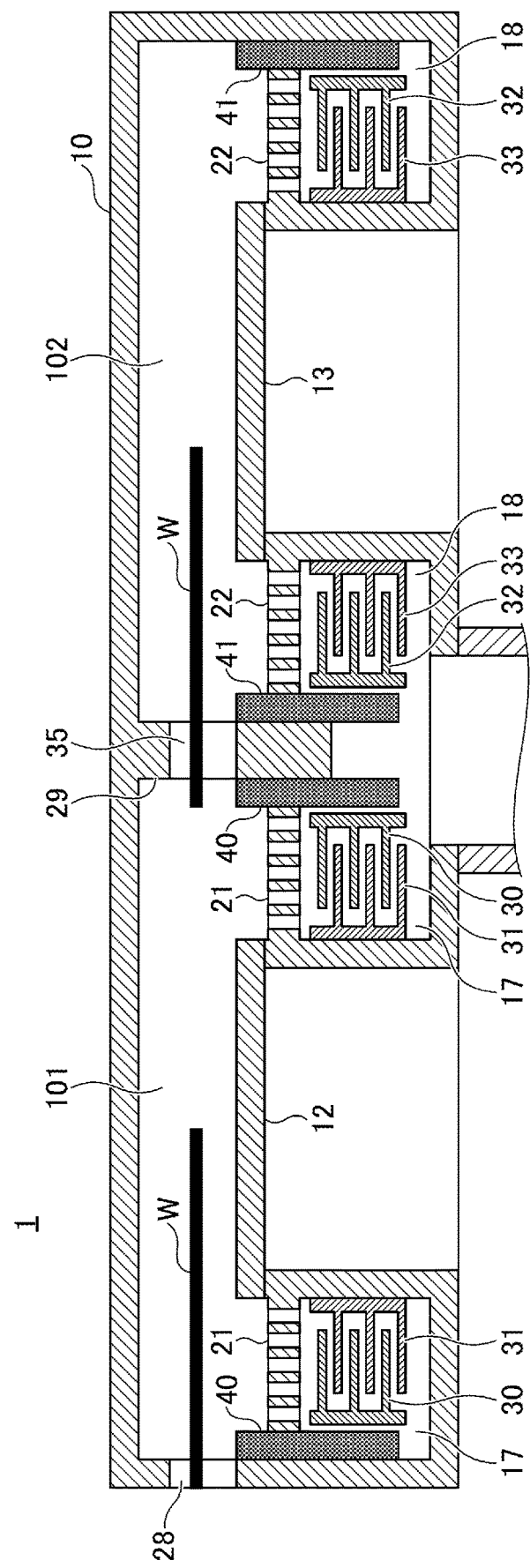
FIG. 6A and FIG. 6B are diagrams illustrating an example of a loading/unloading operation of a wafer.
Figure 6B:
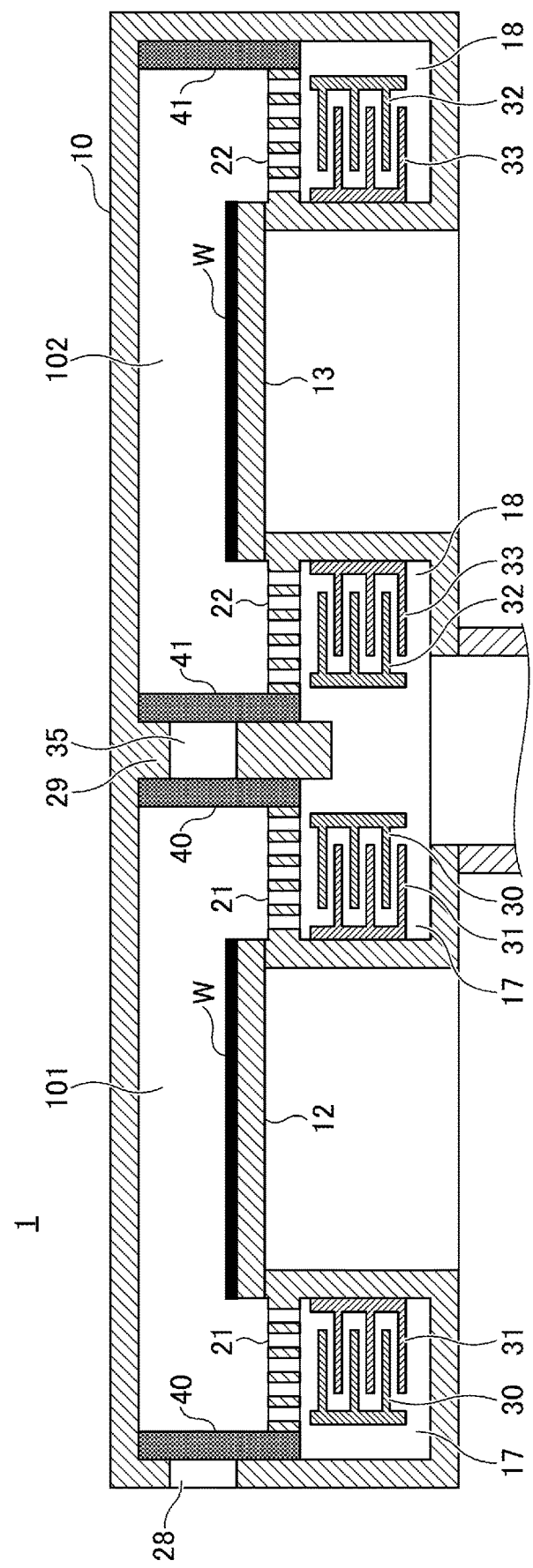

Specifically, when a wafer is loaded or unloaded, as illustrated in FIG. 6A, the shield members 40 and 41 are moved to a position lower than the loading/unloading ports 28 and 35, to open the loading/unloading ports 28 and 35. While a wafer W is being processed, as illustrated in FIG. 6B, the shield members 40 and 41 are lifted upward and moved to a position of the loading/unloading ports 28 and 35, to close the loading/unloading ports 28 and 35.

In the processing apparatus 1 according to the present embodiment, as the loading/unloading ports 28 and 35 are opened and/or closed with the shield members 40 and 41, a shutter is not required. By removing a shutter, unevenness of process in each processing chamber caused by a shutter can be eliminated. Also, by removing a shutter, because an actuator for actuating the shutter and other elements related to the shutter can also be removed, the number of parts composing the processing apparatus can be reduced.

By shielding the loading/unloading ports 28 and 35 using the shield members 40 and 41, conductance in a horizontal direction of the processing vessel 10 according to the present embodiment having multiple processing chambers (such as 101 and 102) can be reduced, even if the loading/unloading ports 28 and 35 are not sealed. Especially in the present embodiment, because the rotors 30 and 32 and the stators 31 and 33 are provided in the exhaust space (such as 17 or 18) of the processing apparatus 1, a pressure in the processing vessel 10 can be controlled by the rotors 30 and 32 and the stators 31 and 33. Accordingly, even if the loading/unloading ports 28 and 35 are not sealed, uniformity of pressure distribution in the processing vessel 10 can be realized.

Figure 7A:
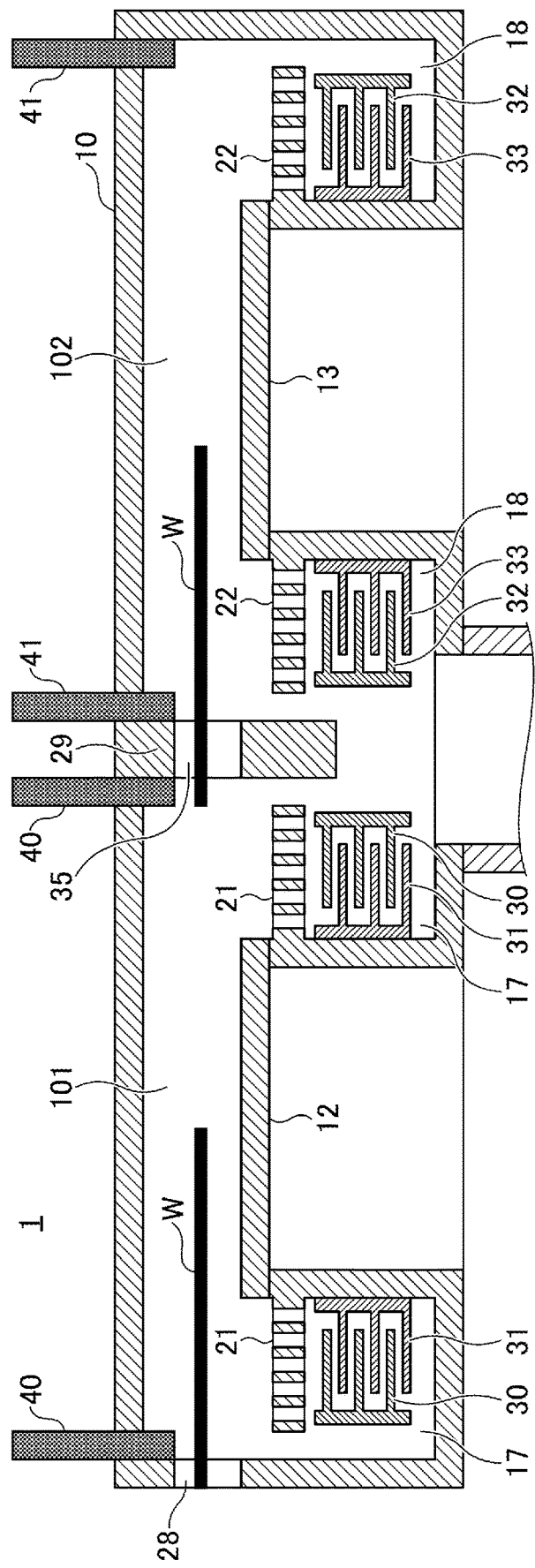
FIG. 7A and FIG. 7B are diagrams illustrating an example of a loading/unloading operation of a wafer.
Figure 7B:
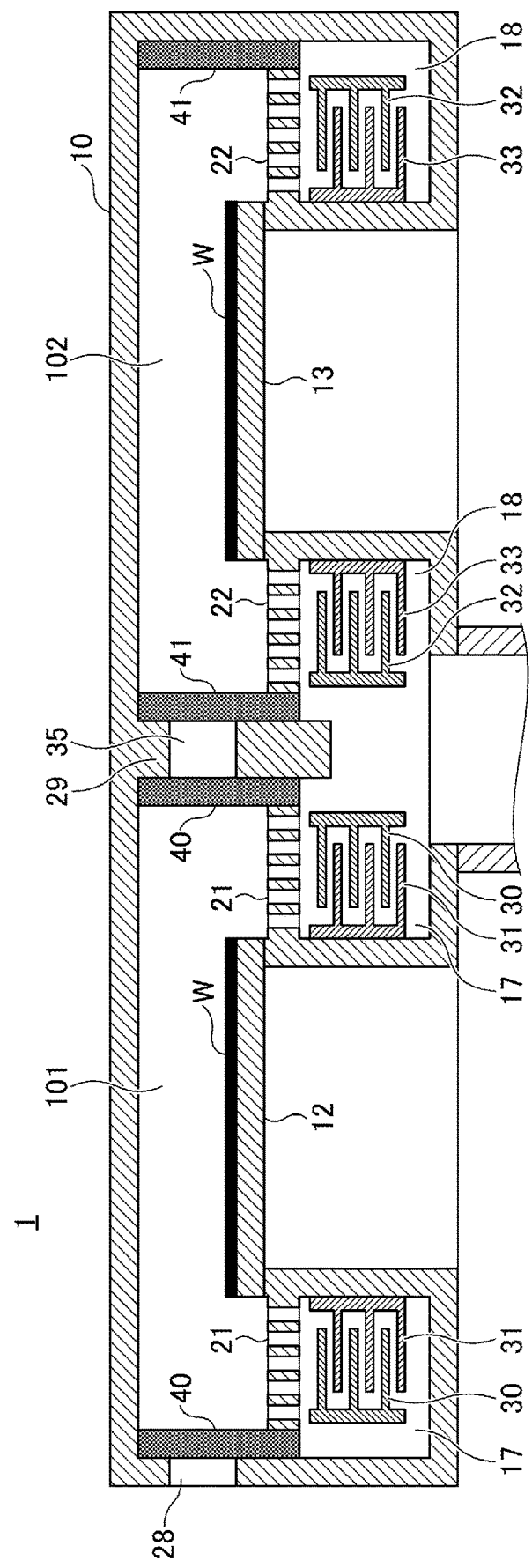
Figure 8A:
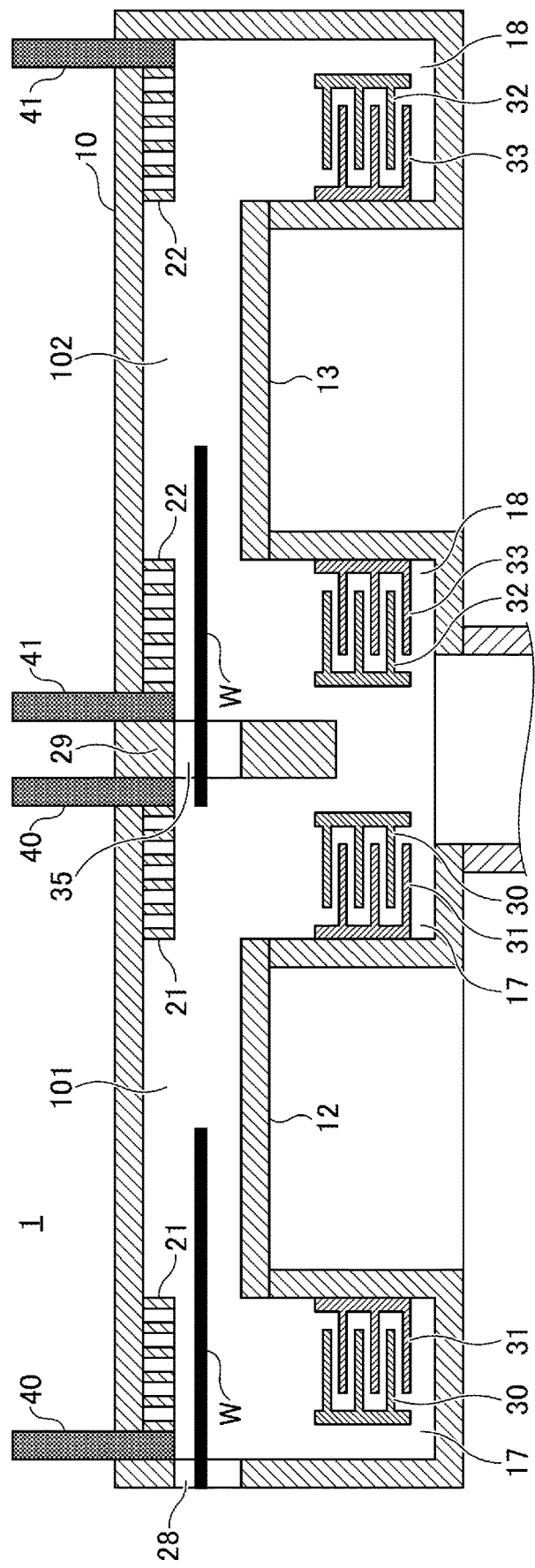
Figure 9A:
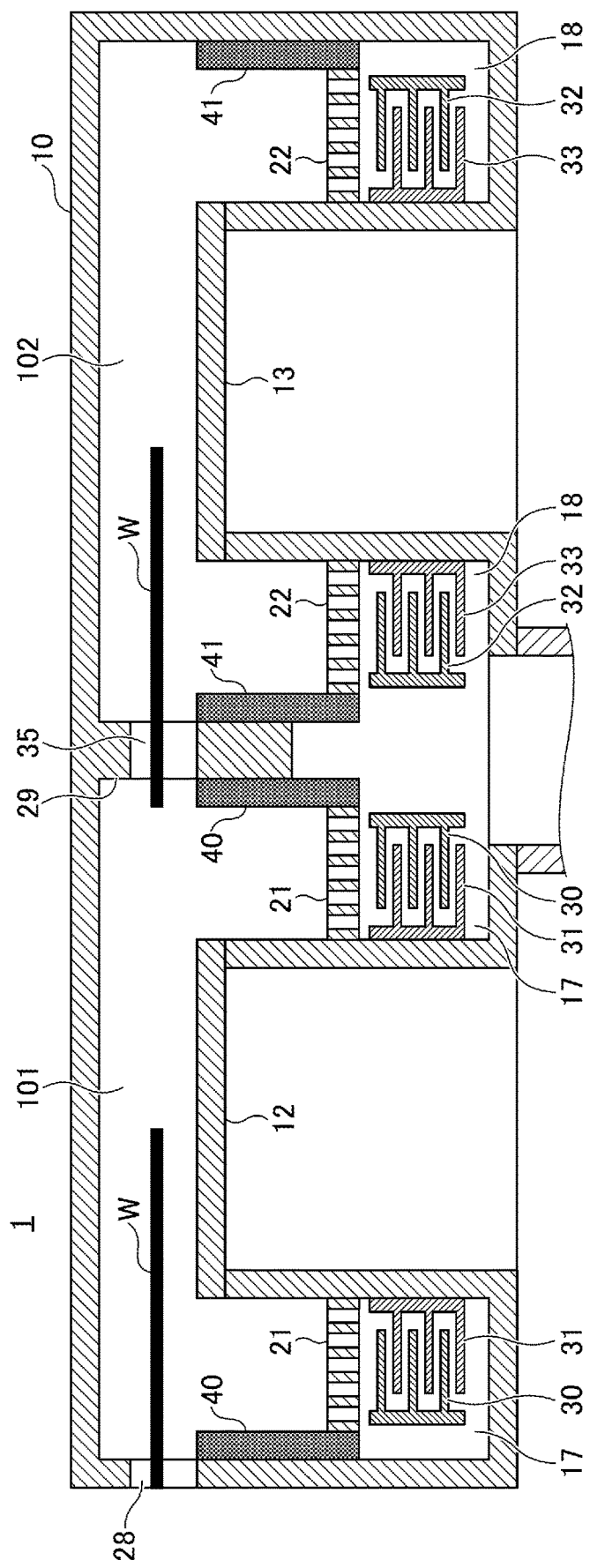
FIG. 9A and FIG. 9B are diagrams illustrating an example of a loading/unloading operation of a wafer.
Figure 9B:
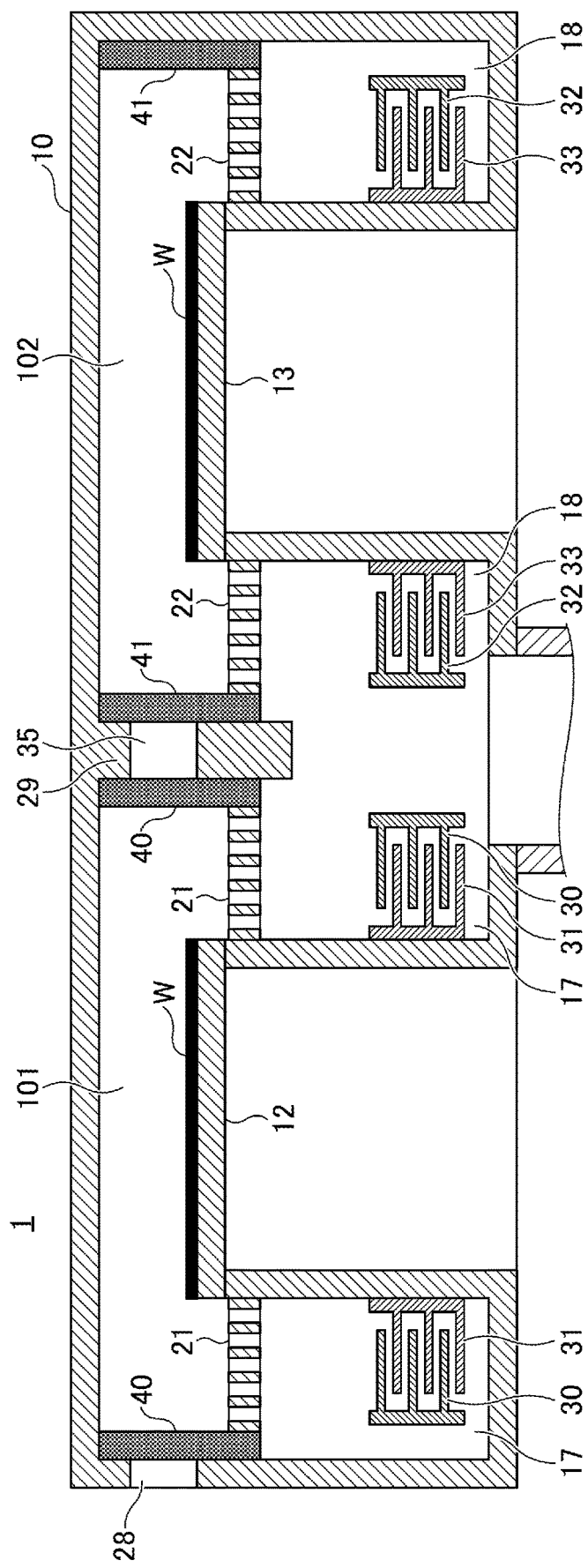

As illustrated in FIGS. 7A and 7B, the shield members 40 and 41 may be configured such that the shield members 40 and 41 move upward and protrude from a ceiling of the processing vessel 10 when the loading/unloading ports 28 and 35 are opened, and that the shield members 40 and 41 move downward when the loading/unloading ports 28 and 35 are closed. Opening and/or closing of the loading/unloading ports 28 and 35 may be realized by rotating the shield members 40 and 41. In this case, a rotating mechanism (not illustrated), such as a bearing, is attached to the shield members 40 and 41. For example, when a wafer W is loaded or unloaded as illustrated in FIG. 7A, the shield members 40 and 41 move to the ceiling of the processing vessel 10 by rotating the shield members 40 and 41, and the loading/unloading ports 28 and 35 are opened. While a wafer W is being processed, as illustrated in FIG. 7B, the loading/unloading ports 28 and 35 are closed by the shield members 40 and 41 being moved to positions of the loading/unloading ports 28 and 35.

As illustrated in FIGS. 8A to 9B, in order to open and/or close the loading/unloading ports 28 and 35, the shield members 40 and 41 may move up and down or may be rotated, with the baffle plates 21 and 22 respectively. If the processing apparatus 1 is configured such that the shield members 40 and 41 move up and down with the baffle plates 21 and 22 respectively (or the shield members 40 and 41 are rotated with the baffle plates 21 and 22 respectively), the number of parts composing the processing apparatus 1 can be further reduced. Also, unevenness of process in each processing chamber caused by a shutter can be eliminated.

Further, as illustrated in FIGS. 6A to 9B, by moving the shield members 40 and 41, a space connecting the processing space directly with the exhaust space can be formed. If such a space is formed, exhaust efficiency is improved and a time required for exhausting gas can be shortened.

Further, each of the shield members 40 and 41 may include a part extending horizontally as an alternative of the baffle plate, and the shield members 40 and 41 may be configured such that holes may be formed in appropriate locations of a horizontal portion or a vertical portion of the shield members 40 and 41. In this case, because parts of the shield members 40 and 41 on which holes are formed can also serve as a role of the baffle plates, the number of parts composing the processing apparatus 1 can be further reduced. Further, by shaping the shield members 40 and 41 such that a volume of the processing space is reduced when the shield members 40 and 41 are moved to a position for a process to a wafer W, running cost can be reduced because resources (such as high frequency electrical power or power of a heater) required for the process are decreased.

Also, the processing apparatus 1 may be configured such that the stages 12 and 13 lift to a level of the loading/unloading port 28 when a wafer W is loaded or unloaded, and that a wafer W is transferred from/to a transfer arm to/from lift pins to load/unload the wafer W through the loading/unloading port 28.

In the above embodiment, the processing apparatus and the exhaust method have been described. However, a processing apparatus and an exhaust method according to the present invention are not limited to the above embodiment. Various changes or enhancements can be made hereto within the scope of the present invention. Matters described in the above embodiments may be combined unless inconsistency occurs.

The processing apparatus according to the present invention can be applicable to any type of plasma processing apparatuses, such as a capacitively coupled plasma (CCP) type, an inductively coupled plasma (ICP) type, a radial line slot antenna type, an electron cyclotron resonance plasma (ECR) type, and a helicon wave plasma (HWP) type.

What is claimed is:

1. A plasma processing apparatus comprising:
   a plurality of plasma processing chambers, each of the plurality of plasma processing chambers having a substrate support;
   a plurality of rotor blades and a plurality of stator blades disposed around the substrate support of each of the plurality of plasma processing chambers;
   a controller configured to control a rotational speed of the plurality of rotor blades; and
   an exhaust space disposed at a bottom of the plurality of plasma processing chambers; and
   a turbo molecular pump connected to the plurality of plasma processing chambers,
   wherein each of the plurality of plasma processing chambers has a bottom wall and an opening through the bottom wall, and the opening of one of the plurality of plasma processing chambers and the opening of another one of the plurality of plasma processing chambers are contiguous with each other to together form one hole, the bottom wall being situated directly below the plurality of rotor blades and the plurality of stator blades, the opening facing the plurality of rotor blades and the plurality of stator blades in a vertical direction,
   wherein the turbo molecular pump is connected to the opening of the bottom wall and situated below the bottom wall, the plurality of rotor blades and the plurality of stator blades being situated above the bottom wall, and
   wherein the plurality of stator blades are fixed to walls separating the plasma processing chambers, and the plurality of rotor blades are located further inside than the plurality of stator blades within each of the plasma processing chambers.

2. The plasma processing apparatus as claimed in claim 1, wherein the controller controls the rotational speed of the plurality of rotor blades independently for each of the plurality of plasma processing chambers.

3. The plasma processing apparatus as claimed in claim 2, wherein each of the plurality of rotor blades and each of the plurality of stator blades are slanted, and are alternately disposed along the substrate support.

4. The plasma processing apparatus as claimed in claim 3, further comprising at least one baffle plate configured to separate the exhaust space from a plasma processing space of at least one of the plurality of plasma processing chambers.

5. The plasma processing apparatus as claimed in claim 4, wherein the at least one baffle plate is configured to move vertically or rotate around the substrate support.

6. The plasma processing apparatus as claimed in claim 1, wherein each of the plurality of rotor blades and each of the plurality of stator blades are slanted, and are alternately disposed along the substrate support.

7. The plasma processing apparatus as claimed in claim 6, further comprising at least one baffle plate configured to separate the exhaust space from a plasma processing space of at least one of the plurality of plasma processing chambers.

8. The plasma processing apparatus as claimed in claim 7, wherein the at least one baffle plate is configured to move vertically or rotate around the substrate support.

9. The plasma processing apparatus as claimed in claim 1, further comprising at least one baffle plate configured to separate the exhaust space from a plasma processing space of at least one of the plurality of plasma processing chambers.

10. The plasma processing apparatus as claimed in claim 9, wherein the at least one baffle plate is configured to move vertically or rotate around the substrate support.

11. The plasma processing apparatus as claimed in claim 1, wherein a loading and unloading port is formed through each of the walls.

12. A plasma processing apparatus comprising:
a first plasma processing chamber;
a second plasma processing chamber adjacent to the first plasma processing chamber;
a first substrate support disposed in the first plasma processing chamber;
a second substrate support disposed in the second plasma processing chamber;
a first movable member and a first static member disposed around the first substrate support, the first movable member having a plurality of first rotor blades, the first static member having a plurality of first stator blades, the plurality of first rotor blades and the plurality of first stator blades being alternately arranged along a vertical direction, a first exhaust space being formed below the first movable member and the first static member;
a second movable member and a second static member disposed around the second substrate support, the second movable member having a plurality of second rotor blades, the second static member having a plurality of second stator blades, the plurality of second rotor blades and the plurality of second stator blades being alternately arranged along the vertical direction, a second exhaust space being formed below the second movable member and the second static member;
at least one actuator configured to simultaneously or separately rotate the first movable member and the second movable member;
a controller configured to control the at least one actuator; and
a turbo molecular pump in communication with the first exhaust space and the second exhaust space,
wherein each of the first plasma processing chamber and the second plasma processing chamber has a bottom wall and an opening through the bottom wall, and the opening of the first plasma processing chamber and the opening of the second plasma processing chamber are contiguous with each other to together form one hole, the bottom wall of the first plasma processing chamber being situated directly below the plurality of first rotor blades and the plurality of first stator blades, the bottom wall of the second plasma processing chamber being situated directly below the plurality of second rotor blades and the plurality of second stator blades, the opening of the first plasma processing chamber facing the plurality of first rotor blades and the plurality of first stator blades in the vertical direction, the opening of the second plasma processing chamber facing the plurality of second rotor blades and the plurality of second stator blades in the vertical direction,
wherein the turbo molecular pump is connected to the opening of the first plasma processing chamber and the opening of the second plasma processing chamber and situated below the bottom wall of the first plasma processing chamber and the bottom wall of the second plasma processing chamber, the plurality of first rotor blades and the plurality of first stator blades being situated above the bottom wall of the first plasma processing chamber, the plurality of second rotor blades and the plurality of second stator blades being situated above the bottom wall of the second plasma processing chamber,
wherein the plurality of first stator blades are fixed to a wall of the first plasma processing chamber separating the first plasma processing chamber from the second plasma processing chamber, and the plurality of first rotor blades are located further inside than the plurality of first stator blades within the first plasma processing chamber, and
wherein the plurality of second stator blades are fixed to a wall of the second plasma processing chamber separating the second plasma processing chamber from the first plasma processing chamber, and the plurality of second rotor blades are located further inside than the plurality of second stator blades within the second plasma processing chamber.

13. The plasma processing apparatus as claimed in claim 12, further comprising at least one baffle plate configured to separate the first exhaust space from a plasma processing space of the first plasma processing chamber.

14. The plasma processing apparatus as claimed in claim 13, wherein the at least one baffle plate is configured to move vertically or rotate around the first substrate support.

15. The plasma processing apparatus as claimed in claim 12, wherein a loading and unloading port is formed through each of the wall of the first plasma processing chamber and the wall of the second plasma processing chamber.

* * * * *